(12) United States Patent
Lee et al.

(10) Patent No.: US 8,084,815 B2
(45) Date of Patent: Dec. 27, 2011

(54) SUPERJUNCTION SEMICONDUCTOR DEVICE

(75) Inventors: Jae-gil Lee, Gyeonggi-do (KR);
Jin-young Jung, Gyeonggi-do (KR);
Ho-cheol Jang, Gyeonggi-do (KR);
Chong-man Yun, Seoul (KR)

(73) Assignee: Fairchild Korea Semiconductor Ltd. (KR)

( * ) Notice: Subject to any disclaimer, the term of this patent is extended or adjusted under 35 U.S.C. 154(b) by 359 days.

(21) Appl. No.: 11/172,455

(22) Filed: Jun. 29, 2005

(65) Prior Publication Data

US 2007/0001230 A1    Jan. 4, 2007

(51) Int. Cl.
*H01L 29/66*    (2006.01)

(52) U.S. Cl. ............. 257/341; 257/E29.256; 257/127; 257/484; 257/605; 257/606; 257/620

(58) Field of Classification Search ............... 257/341, 257/E29.256, 127, 484, 605, 606, 620
See application file for complete search history.

(56) References Cited

U.S. PATENT DOCUMENTS

| | | | |
|---|---|---|---|
| 5,216,275 A * | 6/1993 | Chen ............................ | 257/493 |
| 5,545,915 A * | 8/1996 | Disney et al. ................ | 257/491 |
| 6,677,626 B1 * | 1/2004 | Shindou et al. ............... | 257/266 |
| 6,724,042 B2 | 4/2004 | Onishi et al. | |
| 2003/0222327 A1 * | 12/2003 | Yamaguchi et al. .......... | 257/500 |
| 2004/0065921 A1 * | 4/2004 | Iwamoto et al. .............. | 257/341 |
| 2005/0167742 A1 * | 8/2005 | Challa et al. .................. | 257/328 |

FOREIGN PATENT DOCUMENTS

| | | |
|---|---|---|
| JP | 2002-280555 A | 9/2002 |
| KR | 10-2005-0095385 A | 9/2005 |

* cited by examiner

*Primary Examiner* — Lynne Gurley
*Assistant Examiner* — Hsin-Yi Hsieh
(74) *Attorney, Agent, or Firm* — Kilpatrick Townsend & Stockton LLP

(57) ABSTRACT

A superjunction semiconductor device includes an edge p pillar, an active region, and a termination region. The edge p pillar has a rectangular ring shape with rounded corners surrounding the active region. The active region includes an active n region and active p pillars having vertical stripe shapes disposed at regular intervals in the active n region. The top and bottom ends of the active p pillars are separated from the edge p pillar. The termination region includes termination n pillars and termination p pillars alternately arranged around the edge p pillar. Surplus p charges that are not used to balance the quantity of p charges and the quantity of n charges among p charges included in the upper and lower parts of the edge p pillar are eliminated or n charges are supplemented to balance the quantity of p charges and the quantity of n charges.

15 Claims, 9 Drawing Sheets

SUPERJUNCTION SEMICONDUCTOR DEVICE

CROSS-REFERENCES TO RELATED APPLICATIONS

NOT APPLICABLE

BACKGROUND OF THE INVENTION

The present invention relates to a semiconductor device, and more particularly, to a superjunction semiconductor device having an alternating conductivity type drift layer.

In general, a vertical type semiconductor device has a structure in which electrodes are arranged on two planes opposite to each other. When the vertical type semiconductor device is turned on, a drift current flows vertically in the semiconductor device. When the vertical type semiconductor device is turned off, depletion regions formed when a reverse bias voltage is applied to the device extend in the horizontal direction. To provide a high breakdown voltage to the vertical type semiconductor device, a drift layer disposed between the electrodes is formed of a material having high resistivity and the thickness of the drift layer is increased. In this case, however, an ON resistance of the device is also increased. This reduces conductivity and a switching speed, thereby degrading the operating characteristic of the device. It is well known that the ON resistance of the device is proportional to the breakdown voltage of the device to the power 2.5.

To solve this problem, a semiconductor device having a new junction structure has been recently proposed. This semiconductor device includes an alternating conductivity type drift layer composed of n regions (n pillar) and p regions (p pillar) alternately arranged. The alternating conductivity type drift layer forms a current path when the semiconductor device is turned on and is depleted when the semiconductor device is turned off. A semiconductor device having the alternating conductivity type drift layer is called a "superjunction semiconductor device".

Figure 1:
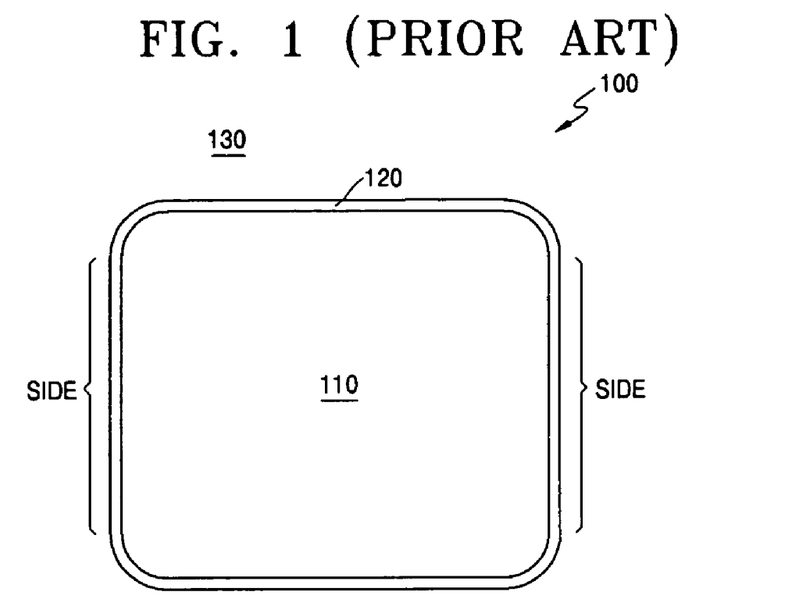
FIG. 1 is a layout of a conventional superjunction semiconductor device.

FIG. 1 is a layout of a conventional superjunction semiconductor device 100. Referring to FIG. 1, the superjunction semiconductor device 100 includes an active region 110 surrounded by an edge p pillar 120, and a termination region 130 surrounding the edge p pillar 120. While the edge p pillar 120 and the termination region 130 are separate from each other in FIG. 1, the edge p pillar 120 can be included in the termination region 130 under certain circumstances. The edge p pillar 120 is in the form of a rectangular ring with rounded corners. A plurality of active p pillars (not shown) and active n pillars (not shown) are alternately arranged in the horizontal direction in the active region 110. The active p pillars and the active n pillars form vertical strips. In addition, a plurality of termination p pillars (not shown) and termination n pillars (not shown) having the same form as the edge p pillar 120 are alternately arranged in the termination region 130, surrounding the edge p pillar 120.

In general, the superjunction semiconductor device 100 is designed to have a breakdown voltage larger in the termination region 130 than in the active region 110 because it is not desirable for breakdown to occur first in the termination region 130. To allow the superjunction semiconductor device 100 to have the higher breakdown voltage in the termination region 130 than in the active region 110, the difference in quantity of n charges and p charges is greater in the active region than in the termination region 130. However, these differences in quantity are very similar in the active region 110 and in the termination region 130. The quantity of n charges and the quantity of p charges must be balanced in both the active region 110 and the termination region 130 for the superjunction semiconductor device 100 to have satisfactory breakdown characteristic. However, the difference in the quantity of n charges and the quantity of p charges is greater in the upper part, lower part and corners of the edge p pillar 120, which come into contact with the active region 110, than in other parts. This deteriorates the breakdown characteristics of the superjunction semiconductor device.

Figure 2:
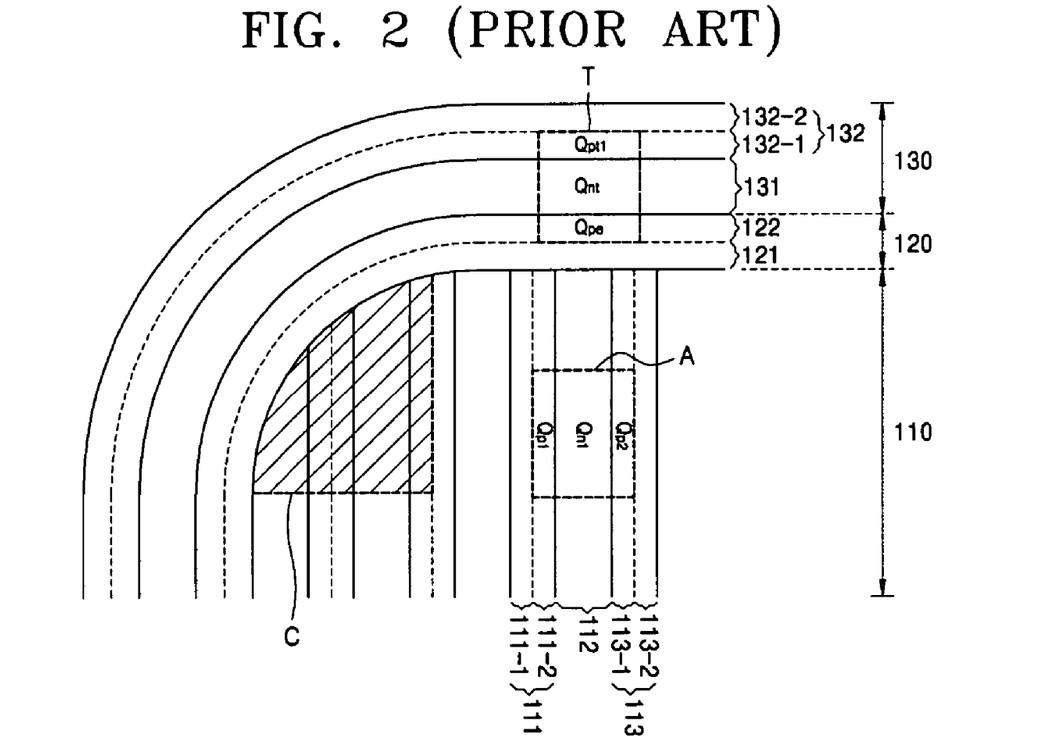
FIG. 2 illustrates a corner and a portion of the upper part of the superjunction semiconductor device of FIG. 1.

FIG. 2 illustrates a corner and a portion of the upper part of the superjunction semiconductor device 100 of FIG. 1. Referring to FIG. 2, the active p pillars and the active n pillars are arranged in a region outside a corner region C, and upper and lower parts of the active region 110 such that the quantity of p charges in the active p pillars and the quantity of n charges in the active n pillars are equal. In the case of a unit cell A, for example, an active p pillar 111 having left and right regions 111-1 and 111-2 about a vertical central axis, an active n pillar 112, and an active p pillar 113 having left and right regions 113-1 and 113-2 about a the vertical central axis are arranged sequentially. Here, the sum (Qp1+Qp2) of the quantity of p charges Qp1 in the right region 111-2 of the active p pillar 111 and the quantity of p charges Qp2 in the left region 113-1 of the active p pillar 113 in the unit cell A and the quantity of n charges Qn1 in the active n pillar 112 disposed between the active p pillars 111 and 113 are equal. The balance of the quantity of charges is kept in all parts of the active region 110.

The termination p pillars and the termination n pillars are alternately arranged in the termination region 130 such that the quantity of p charges in the termination p pillar and the quantity of n charges in the termination n pillar are equal. In the case of a unit cell T shown in FIG. 2, for example, a termination n pillar 131 and a termination p pillar 132 are sequentially arranged outside the edge p pillar 120 having inner and outer regions 121 and 122 about a central axis. The termination p pillar 132 has inner and outer regions 132-1 and 132-2 about a central axis. Here, the sum Qpe+Qpt1 of the quantity of p charges Qpe in the outer region 122 of the edge p pillar 120 and the quantity of p charges Qpt1 in the inner region 132-1 of the termination p pillar 132 and the quantity of n charges Qnt in the termination n pillar 131 are equal. The balance of the quantity of charges is kept in all parts of the termination region 130.

However, the quantity of p charges and the quantity of n charges are severely unbalanced in the upper part, lower part and corners of the active region 110, which come into contact with the edge p pillar 120, because these parts do not have n charges that will be balanced with the p charges in the inner region 121 of the edge p pillar 120. More specifically, along vertical edges of the active region, the quantity of p charges in the inner region 121 of the edge p pillar 120 is equal to the quantity of charges in the active n pillars in the active region 110 parallel to the edge p pillar 120. The quantity of p charges and the quantity of n charges are balanced in the entire termination region 130 and the outer region 122 of the edge p pillar 120. However, the quantity of n charges in the inner region 121 in the corners, upper and lower parts of the edge p pillar 120 are not balanced, and surplus p charges exist. These surplus p charges break the balance between the quantity of p charges and the quantity of n charges in the corners, upper and lower parts of the edge p pillar and result in a deterioration of the breakdown characteristics of the superjunction semiconductor device.

BRIEF SUMMARY OF THE INVENTION

The present invention provides a superjunction semiconductor device for balancing the quantity of p charges and the quantity of n charges to prevent breakdown characteristic from being deteriorated in a specific region.

According to an aspect of the present invention, there is provided a superjunction semiconductor device including an edge p pillar, an active region, and a termination region. The edge p pillar has a rectangular ring shape with rounded corners surrounding the active region. The active region includes active p pillars having vertical stripe shapes disposed in an active n region. The top and bottom ends of the active p pillars are separated from the edge p pillar. The termination region includes termination n pillars and termination p pillars alternately arranged around the edge p pillar.

The distance between the central axis of the edge p pillar and the top end of each of the active p pillars can be equal to half the distance between the vertical central axes of neighboring active p pillars. The distance between the central axis of each side of the edge p pillar and the vertical central axis of the corresponding active p pillar disposed closest to each side of the edge p pillar can be identical to the distance between the vertical central axes of neighboring active p pillars.

The width of the edge p pillar can be identical to the width of each of the active p pillars.

The widths of the upper and lower parts of the active p pillars can be gradually decreased or increased toward each end of the upper and lower parts in the corners of the active region. Here, the widths of the upper and lower parts of the active p pillars are gradually decreased when the quantity of p charges is larger than the quantity of n charges and gradually increased when the quantity of p charges is smaller than the quantity of n charges.

The superjunction semiconductor device may further include subsidiary p pillars arranged in the active n region in order to compensate for the small quantity of p charges in the active p pillars in the corners of the active region. The subsidiary p pillars can have bar shapes vertically arranged in the active n region in the corners of the active region. The subsidiary p pillars can be in the form of islands arranged at predetermined intervals in the active n region in the corners of the active region. Furthermore, the subsidiary p pillars can have bent belt shapes arranged along the inner side of and contacting the edge p pillar in the active n region in the corners of the active region.

According to another aspect of the present invention, there is provided a superjunction semiconductor device including an edge p pillar, an active region, and a termination region. The edge p pillar has a first width and a rectangular ring shape with rounded corners. The active region is surrounded by the edge p pillar and has active p pillars and active n pillars having vertical stripe shapes with a second width twice the first width. The active p pillars and the active n pillars are alternately arranged in the horizontal direction in the active region. The termination region includes termination n pillars and termination p pillars alternately arranged around the edge p pillar.

The distance between the central axis of each side of the edge p pillar and the vertical central axis of the corresponding active p pillar disposed closest to each side of the edge p pillar is equal to half the distance between the vertical central axes of neighboring active p pillars.

The widths of the upper and lower parts of the active p pillars are gradually decreased or increased in the corners of the active region. Here, the widths of the upper and lower parts of the active p pillars are gradually decreased when the quantity of p charges is larger than the quantity of n charges and gradually increased when the quantity of p charges is smaller than the quantity of n charges.

The superjunction semiconductor device further includes subsidiary p pillars arranged in the active n pillars to compensate for the small quantity of p charges in the active p pillars in the corners of the active region. The subsidiary p pillars can have bar shapes vertically arranged in the active n pillars in the corners of the active region. The subsidiary p pillars are in the form of islands arranged at predetermined intervals in the active n pillars in the corner of the active region. Furthermore, the subsidiary p pillars have bent belt shapes arranged along the inner side of and contacting the edge p pillar in the active n pillars in the corners of the active region.

According to another aspect of the present invention, there is provided a superjunction semiconductor device including an edge p pillar, an active region, and a termination region. The edge p pillar has a rectangular ring shape with rounded corners. The edge p pillar has an outer region surrounding the active region and an inner region on in the sides of the active region. The active region has active p pillars and active n pillars having vertical stripe shapes. The active p pillars and the active n pillars are alternately arranged horizontally in the active region. The termination region includes termination n pillars and termination p pillars alternately arranged around the edge p pillar.

The width of the corners, and upper and lower parts of the edge p pillar where only the outer region is arranged is equal to half the width of each of the active p pillars. The width of the edge p pillar where both the outer region and the inner region are arranged is identical to the width of each of the active p pillars.

The distance between the boundary between the outer region and the inner region and the vertical central axis of the active p pillar disposed closest to the edge p pillar is identical to the distance between the vertical central axes of neighboring active p pillars.

The widths of the upper and lower parts of the active p pillars are gradually decreased or increased in the corners of the active region. Here, the widths of the upper and lower parts of the active p pillars are gradually decreased when the quantity of p charges is larger than the quantity of n charges and gradually increased when the quantity of p charges is smaller than the quantity of n charges.

The superjunction semiconductor device further includes subsidiary p pillars arranged in the active n pillars to compensate for the small quantity of p charges in the active p pillars in the corners of the active region. The subsidiary p pillars can have bar shapes vertically arranged in the active n pillars in the corners of the active region. The subsidiary p pillars are in the form of islands arranged at predetermined intervals in the active n pillars in the corners of the active region. The subsidiary p pillars can have bent belt shapes arranged along the inner side of and contacting the edge p pillar in the active n pillars in the corners of the active region.

According to another aspect of the present invention, there is provided a superjunction semiconductor device including an edge p pillar and an active region. The edge p pillar has a rectangular ring shape with rounded corners. The active region is surrounded by the edge p pillar and has active p pillars and active n pillars having vertical striped shapes. The active p pillars and the active n pillars are alternately arranged horizontally in the active region. Island p regions are arranged in a matrix form at predetermined intervals in the corners of the active region. The island p regions are arranged in n regions having the same impurity concentration as that of the active n pillars.

The superjunction semiconductor device further includes a termination region includes termination n pillars and termination p pillars alternately arranged around the edge p pillar.

According to another aspect of the present invention, there is provided a superjunction semiconductor device including an edge p pillar and an active region. The edge p pillar has a rectangular ring shape with rounded corners. The active region is surrounded by the edge p pillar and has active p pillars and active n pillars having vertical stripe shapes. The active p pillars and the active n pillars are alternately arranged horizontally in the active region. Subsidiary p pillars are arranged in the active n pillars in the corners of the active region. The subsidiary p pillars compensate for an imbalance between the quantity of p charges and the quantity of n charges.

Preferably, the subsidiary p pillars have bar shapes vertically arranged in the active n pillars in the corners. The subsidiary p pillars are in the form of islands arranged at predetermined intervals in the active n pillars in the corners. The subsidiary p pillars have bent belt shapes arranged along the inner side of and contacting the edge p pillar in the active n pillars in the corners.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Figure 3:
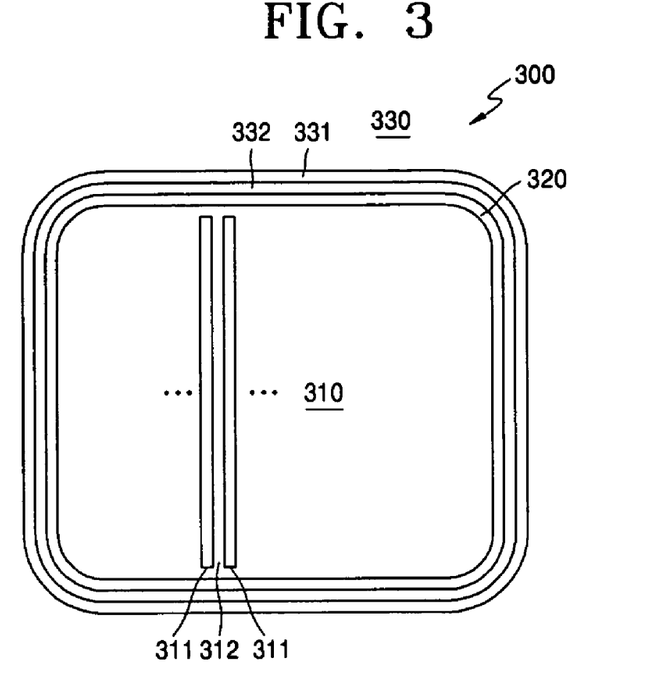
FIG. 3 is a layout of a superjunction semiconductor device according to a first embodiment of the present invention.
Figure 4:
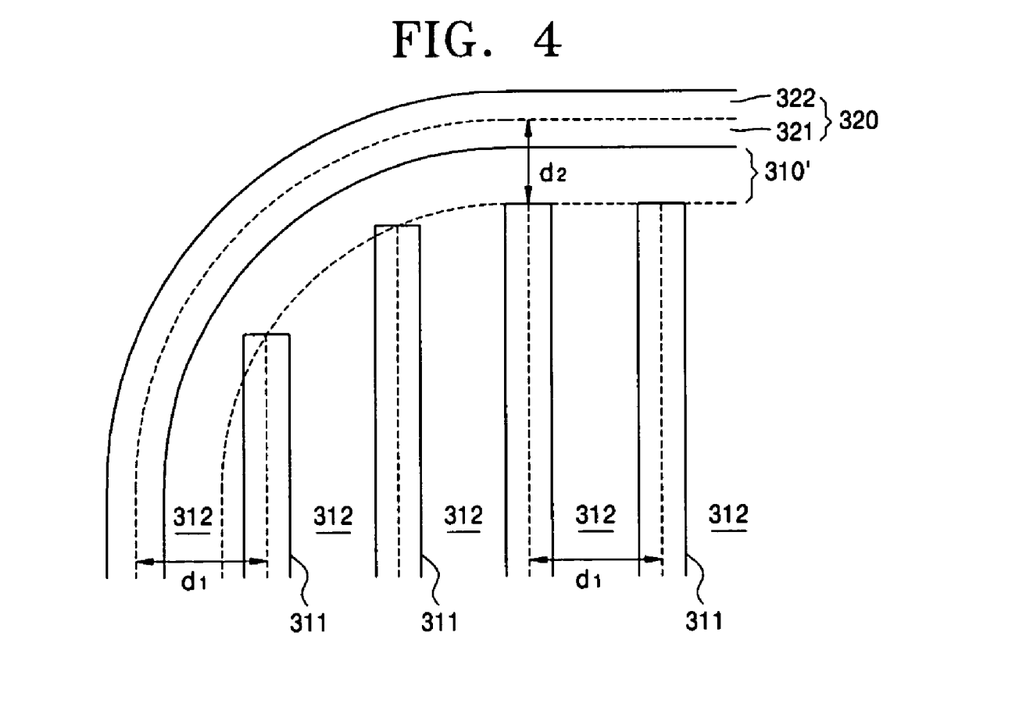
FIG. 4 illustrates a part of the superjunction semiconductor device of FIG. 3.

FIG. 3 is a layout of a superjunction semiconductor device 300 according to a first embodiment of the present invention, and FIG. 4 illustrates a part of the superjunction semiconductor device 300, including a corner of the superjunction semiconductor device 300.

Referring to FIGS. 3 and 4, the superjunction semiconductor device 300 includes an active region 310 surrounded by an edge p pillar 320 in the form of a rectangular ring with rounded corners, and a termination region 330 surrounding the edge p pillar 320. An active n region 312 is disposed in the active region 310, and active p pillars 311 having a striped pattern are arranged in the active n region 312 at predetermined intervals. The active n region 312 can be a conventional n type drift layer or a separate n type region formed on an n type drift layer, that is, an active n pillar. The top and bottom ends of the active p pillars 311 are separated from the edge p pillar 320. In the termination region 330, termination p pillars 331 and termination n pillars 332, which have similar shape as the edge p pillar 320, are alternately arranged.

The distances d1 between vertical central axes of neighboring active p pillars 311 are equal to each other and equal to the distance d1 between the central axis of edge p pillar 320 and the vertical central axis of the active p pillar 311 disposed closest to the edge p pillar 320. As described above, the top ends of the active p pillars 311 are separate from the edge p pillar 320. Accordingly, an n type edge region 310' having a shape similar to the edge p pillar 320 surrounds the active region 310 and comes into contact with the edge p pillar 320. Here, the distance d2 between the central axis of the edge p pillar 320 and the top end of each of the active p pillars 311 equals half the distance d1 between the vertical central axes of neighboring active p pillars 311 arranged in the active region 310. In the superjunction semiconductor device 300, the quantity of n charges included in the n type edge region 310' and the quantity of p charges included in the inner region 321 of the edge p pillar 320 are balanced. Accordingly, surplus p charges included in the inner region 321 of the edge p pillar 320 are balanced with the quantity of n charges to prevent breakdown characteristic from deterioration.

FIGS. 5, 6, 7 and 8 illustrate a part of the superjunction semiconductor device of FIG. 4 according to other embodiments of the present invention. Throughout FIGS. 5, 6, 7 and 8, like reference numerals refer to like elements.

Referring to FIGS. 5, 6, 7 and 8, when the top and bottom ends of the active p pillars 311 have the same width, the quantity of p charges and the quantity of n charges are not balanced in rounded corner regions C11, C12 and C13. Accordingly, the shape of the active p pillar 311 can be appropriately adjusted to ensure that sufficient charges exist in the rounded corner regions C11, C12 and C13.

Figure 5:
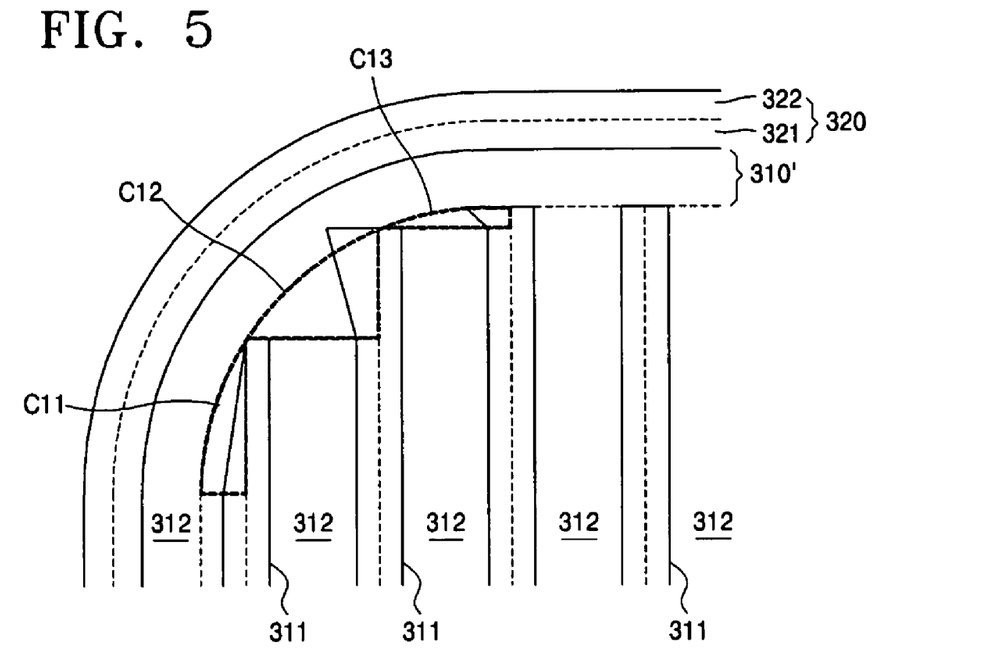
FIGS. 5, 6, 7 and 8 illustrate a part of the superjunction semiconductor device of FIG. 4 according to other embodiments of the present invention.

Referring to FIG. 5, the width of the portion of the active p pillar 311 in a region where the quantity of p charges is larger than the quantity of n charges (such as the region C11) is gradually decreased toward the upper end of the active p pillar 311 to reduce the quantity of p charges and increase the quantity of n charges. The width of the portion of the active p pillar 311 in a region where the quantity of p charges is smaller than the quantity of n charges (such as the regions C12 and C13) is gradually increased toward the upper end of the active p pillar 311 to increase the quantity of p charges and reduce the quantity of n charges.

Figure 6:
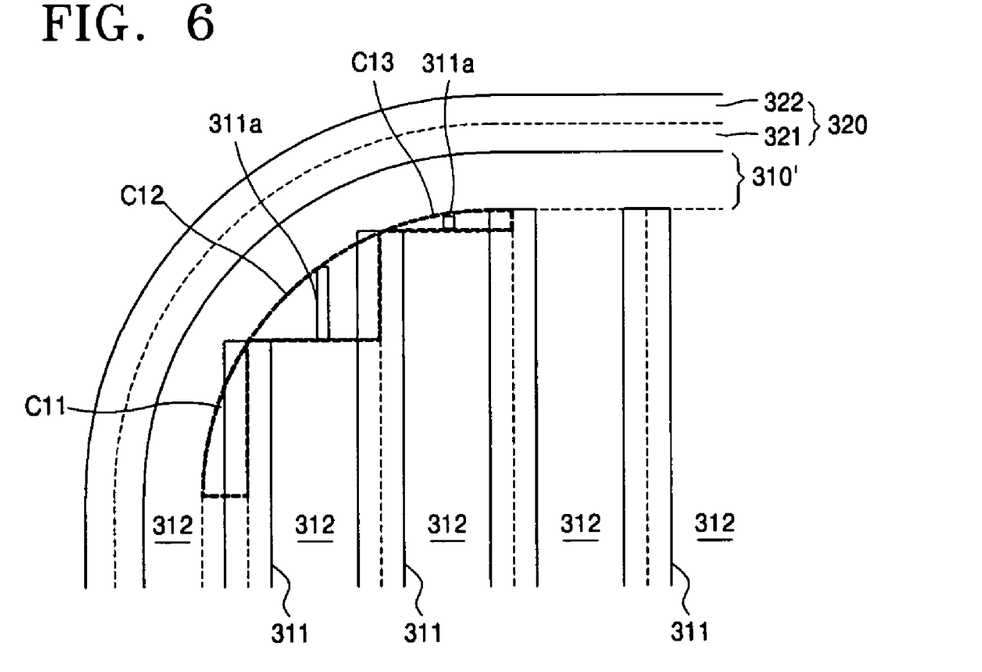

Referring to FIG. 6, subsidiary p pillars 311a in the form of stripes are arranged in regions where the quantity of p charges is smaller than the quantity of n charges (such as the regions C12 and C13). The sizes of the subsidiary p pillars 311a are determined such that the quantity of p charges and the quantity of n charges in the regions C12 and C13 are balanced. That is, the quantity of p charges in the subsidiary p pillars 311*a* is such that the sum of the quantity of p charges of the active p pillars 311 and the quantity of p charges of the subsidiary p pillars 311*a* is equal to the quantity of n charges of the n region 312 in the regions C12 and C13.

Figure 7:
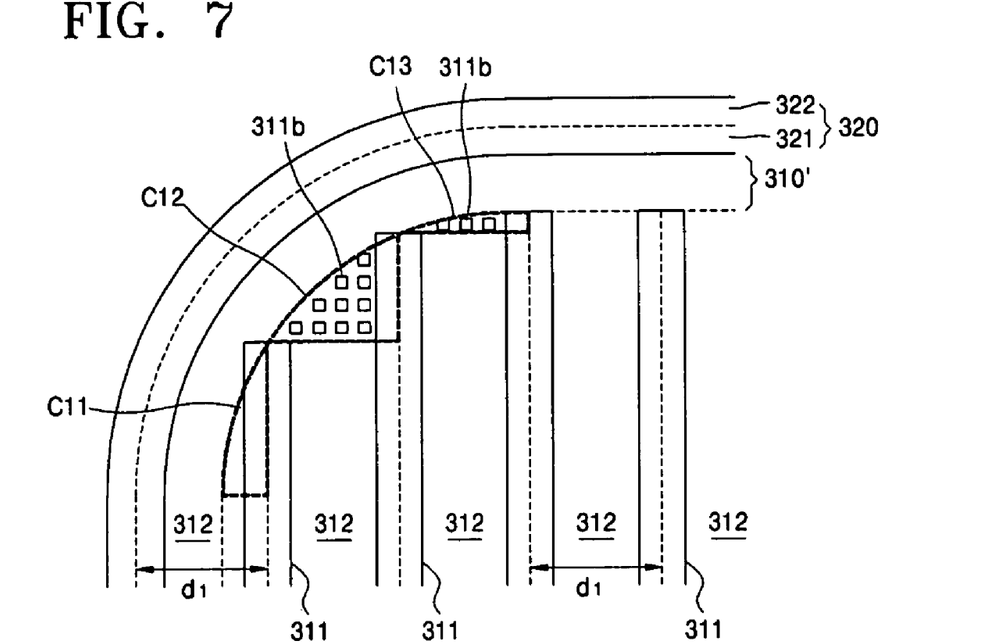

Referring to FIG. 7, when the quantity of p charges is smaller than the quantity of n charges in the regions C12 and C13, subsidiary p pillars 311*b* in the form of floating islands are arranged in the regions C12 and C13. The sizes of the subsidiary p pillars 311*b* are determined such that the quantity of p charges and the quantity of n charges are balanced in the regions C12 and C13. That is, the quantity of p charges in the subsidiary p pillars 311*b* is such that the sum of the quantity of p charges of the active p pillars 311 and the quantity of p charges of the subsidiary p pillars 311*b* is equal to the quantity of n charges of the n region 312 in the regions C12 and C13.

Figure 8:
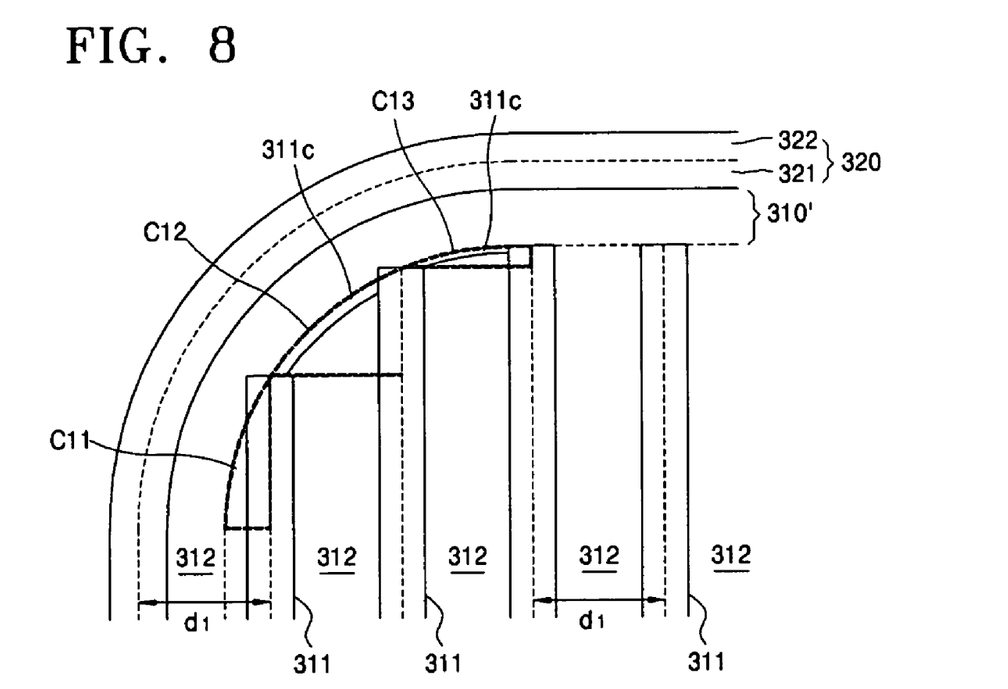

Referring to FIG. 8, when the quantity of p charges is smaller than the quantity of n charges in the regions C12 and C13, subsidiary p pillars 311*c* having belt shapes formed along the rounded corner are arranged in the regions C12 and C13. The sizes of the subsidiary p pillars 311*c* are determined such that the quantity of p charges and the quantity of n charges are balanced in the regions C12 and C13. That is, the quantity of p charges in the subsidiary p pillars 311*c* is such that the sum of the quantity of p charges of the active p pillars 311 and the quantity of p charges of the subsidiary p pillars 311*c* is equal to the quantity of n charges of the n region 312 in the regions C12 and C13.

Figure 9:
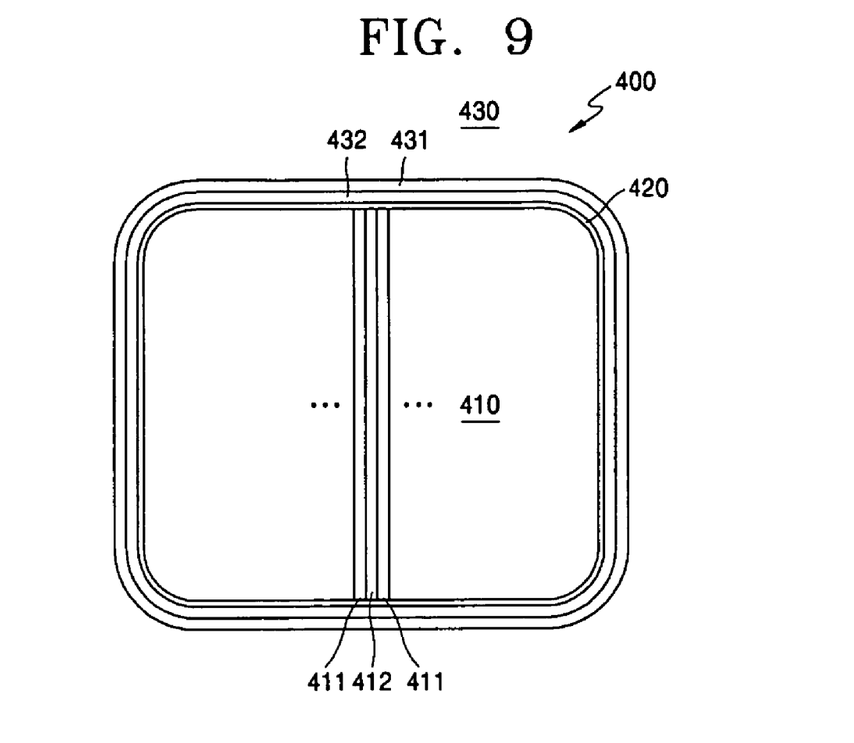
FIG. 9 is a layout of a superjunction semiconductor device according to a second embodiment of the present invention.
Figure 10:
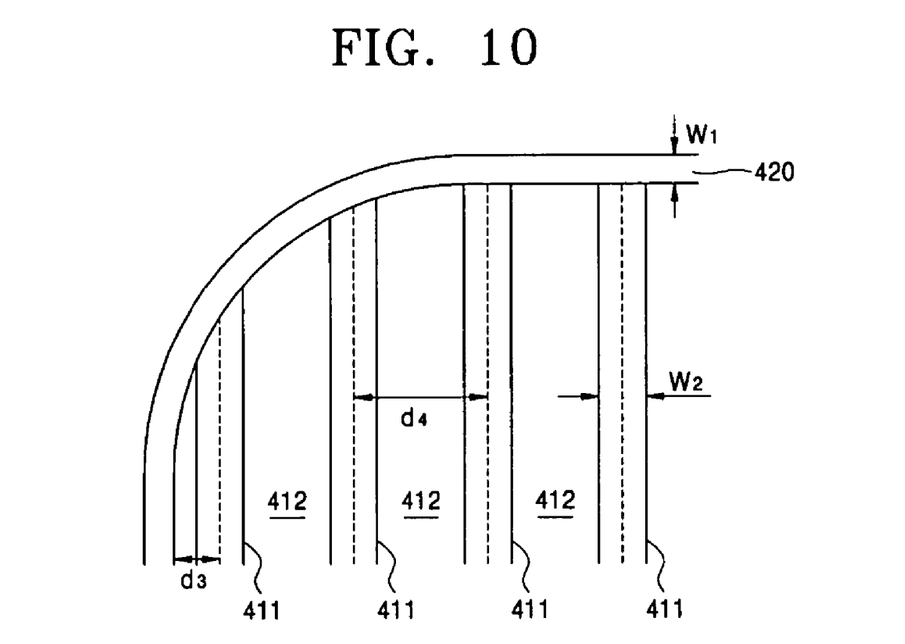
FIG. 10 illustrates a part of the superjunction semiconductor device of FIG. 9.

FIG. 9 is a layout of a superjunction semiconductor device 400 according to a second embodiment of the present invention, and FIG. 10 illustrates a part of the superjunction semiconductor device 400, including a corner of the superjunction semiconductor device 400.

Referring to FIGS. 9 and 10, the superjunction semiconductor device 400 includes an active region 410 surrounded by an edge p pillar 420 having a first width W1 and rounded corners, and a termination region 430 surrounding the edge p pillar 420. The active region 410 has active p pillars 411 and active n pillars 412 having striped shapes which are alternately arranged horizontally. The termination region 430 includes termination p pillars 431 and termination n pillars 432 that have similar shape to the edge p pillar 420, and are alternately arranged. While the top and bottom ends of the active p pillars 311 of the active region 310 are separated from the edge p pillar 320 in the superjunction semiconductor device 300 according to the first embodiment of the present invention, the top and bottom ends of the active p pillars 411 of the active region 410 are connected to the edge p pillar 420 in the superjunction semiconductor device 400 according to the second embodiment of the present invention. In the superjunction semiconductor device 300 according to the first embodiment of the present invention, the top and bottom ends of the active p pillars 311 are separated from the edge p pillar 320 such that the n type edge region 310' contacts the inner region 321 of the edge p pillar 320, and thus the p charges included in the inner region 321 of the edge p pillar 320 are balanced by n charges. In the superjunction semiconductor device 400 according to the second embodiment of the present invention, the top and bottom ends of the active p pillars 411 are connected to the edge p pillar 420 and the inner region of the edge p pillar 420, of which p charges cannot be balanced, is eliminated, to thereby balance the quantity of p charges and the quantity of n charges. Accordingly, the width W1 of the edge p pillar 420 equals half the width W2 of the active p pillar 411. The quantity of p charges included in the edge p pillar 420 and the quantity of n charges included in the termination n pillar are balanced.

In the superjunction semiconductor device 400, to ensure that the quantity of p charges and the quantity of n charges are balanced along the sides of the device, the distance d3 between the side of the edge p pillar 420 and vertical central axis of the closest active p pillar 411 set equal to half the distance d4 between the vertical central axes of neighboring active p pillars 411.

FIGS. 11, 12, 13 and 14 illustrate a part of the superjunction semiconductor device of FIG. 10 according to other embodiments of the present invention. Throughout FIGS. 11, 12, 13 and 14, like reference numerals refer to like elements.

Referring to FIGS. 11, 12, 13 and 14, when the top and bottom ends of the active p pillars 411 have the same width, the quantity of p charges and the quantity of n charges are not balanced in rounded corner regions C21, C22 and C23. Accordingly, the shapes of the active p pillars 411 can be appropriately adjusted to ensure that sufficient charges are supplemented in the rounded corner regions C21, C22 and C23.

Figure 11:
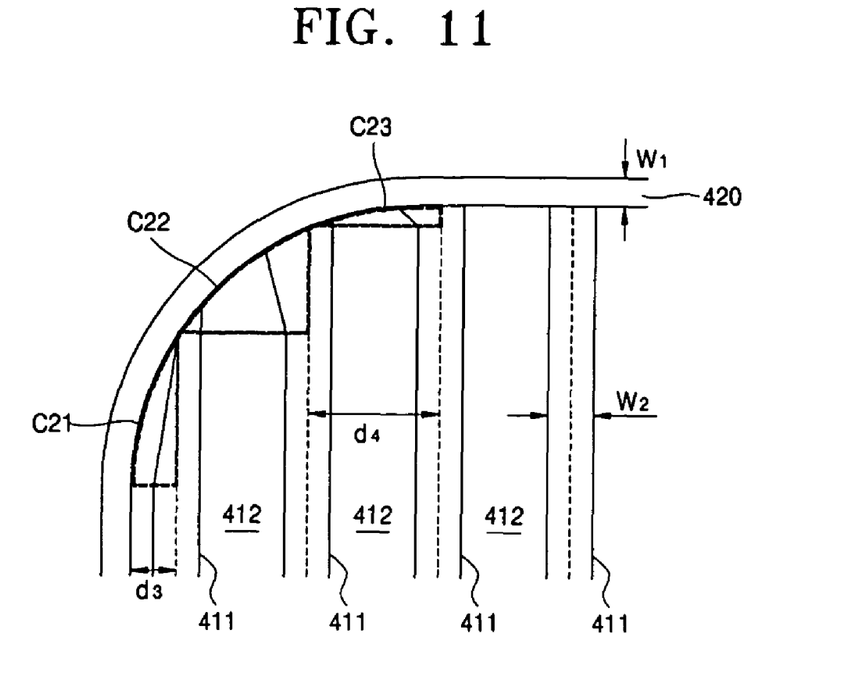
FIGS. 11, 12, 13 and 14 illustrate a part of the superjunction semiconductor device of FIG. 10 according to other embodiments of the present invention.

Referring to FIG. 11, the width of the portion of the active p pillar 411 in a region where the quantity of p charges is larger than the quantity of n charges (such as the region C21) is gradually decreased toward the upper end of the active p pillar 411 to reduce the quantity of p charges and increase the quantity of n charges. The width of the portion of the active p pillar 411 in a region where the quantity of p charges is smaller than the quantity of n charges (such as the regions C22 and C23) is gradually increased toward the upper end of the active p pillar 411 to increase the quantity of p charges and reduce the quantity of n charges.

Figure 12:
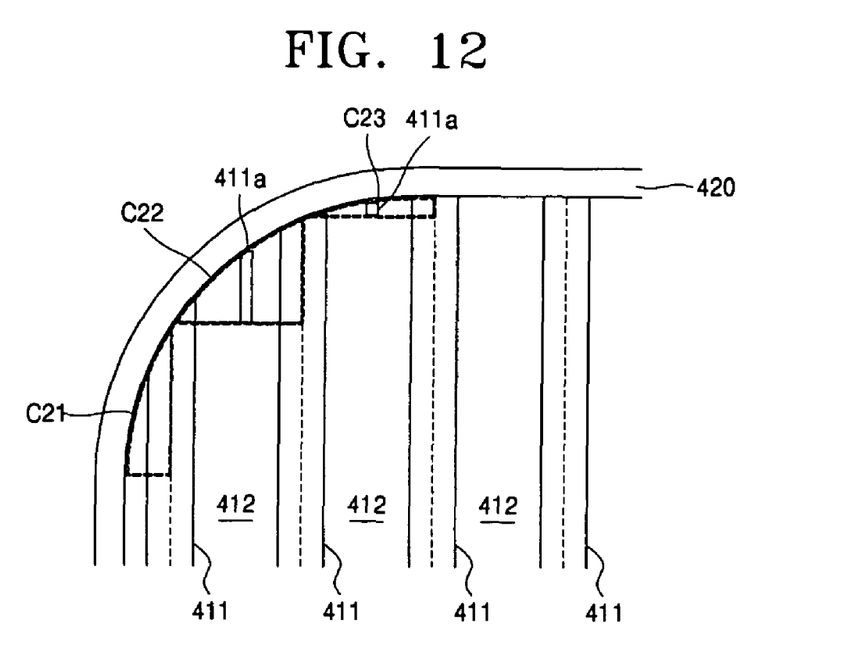

Referring to FIG. 12, subsidiary p pillars 411*a* in the form of stripes are arranged in regions where the quantity of p charges is smaller than the quantity of n charges (such as the regions C22 and C23). The sizes of the subsidiary p pillars 411*a* are determined such that the quantity of p charges and the quantity of n charges are balanced in the regions C22 and C23. That is, the quantity of p charges in the subsidiary p pillars 411*a* is such that the sum of the quantity of p charges of the active p pillars 411 and the quantity of p charges of the subsidiary p pillars 411*a* is equal to the quantity of n charges of the n region 412 in the regions C22 and C23.

Figure 13:
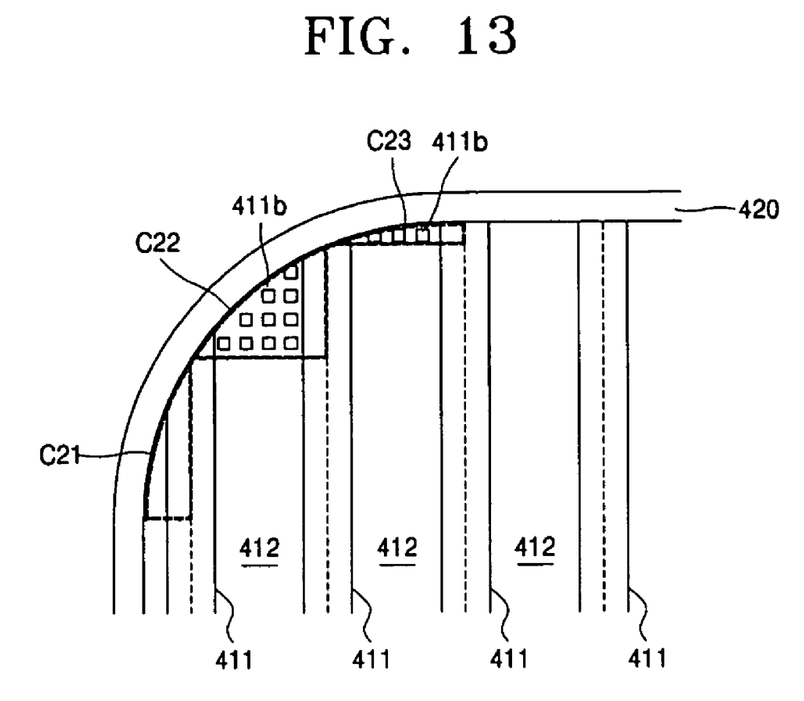

Referring to FIG. 13, when the quantity of p charges is smaller than the quantity of n charges in the regions C22 and C23, subsidiary p pillars 411*b* in the form of floating islands are arranged in the regions C22 and C23. The sizes of the subsidiary p pillars 411*b* are determined such that the quantity of p charges and the quantity of n charges are balanced in the regions C22 and C23. That is, the quantity of p charges in the subsidiary p pillars 411*b* is such that the sum of the quantity of p charges of the active p pillars 411 and the quantity of p charges of the subsidiary p pillars 411*b* is equal to the quantity of n charges of the n region 412 in the regions C22 and C23.

Figure 14:
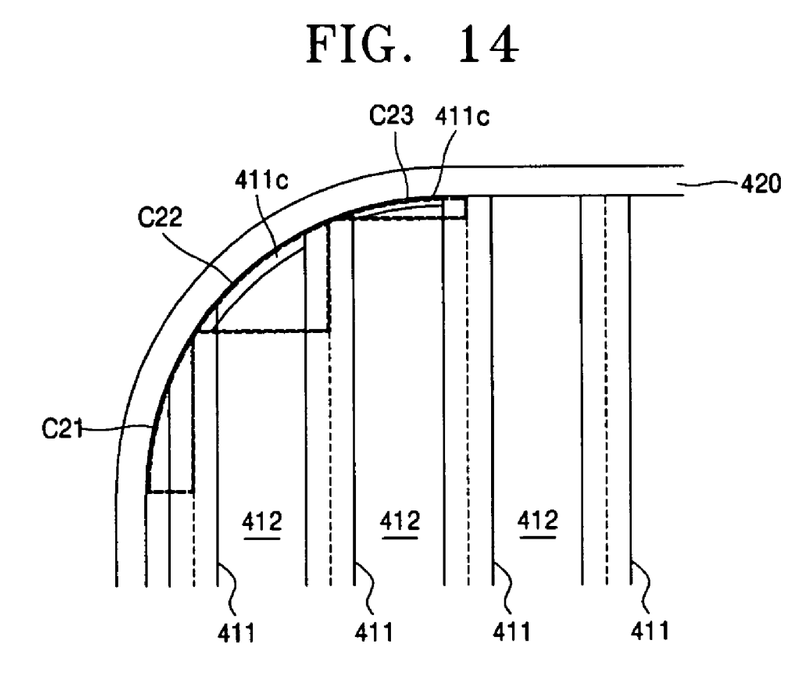

Referring to FIG. 14, when the quantity of p charges is smaller than the quantity of n charges in the regions C22 and C23, subsidiary p pillars 411*c* having belt shapes formed along the rounded corner are arranged in the regions C22 and C23. The sizes of the subsidiary p pillars 411*c* are determined such that the quantity of p charges and the quantity of n charges are balanced in the regions C22 and C23. That is, the quantity of p charges in the subsidiary p pillars 411*c* is such that the sum of the quantity of p charges of the active p pillars 411 and the quantity of p charges of the subsidiary p pillars 411c is equal to the quantity of n charges of the n region 412 in the regions C22 and C23.

Figure 15:
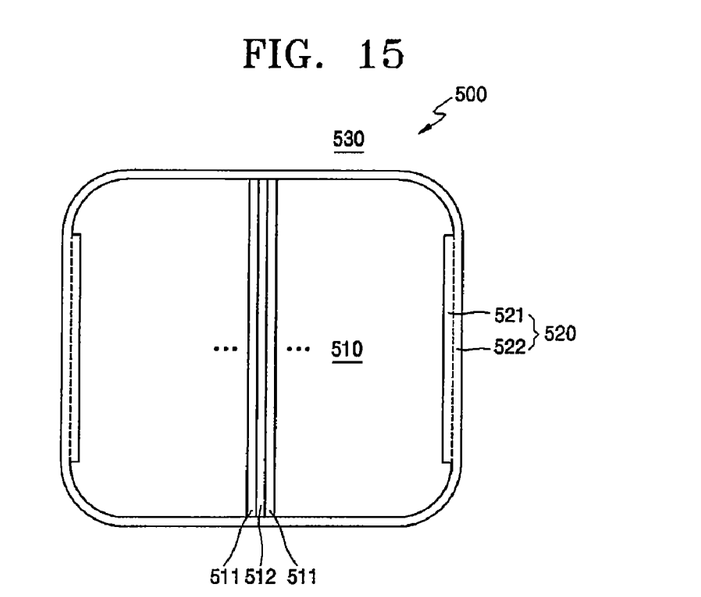
FIG. 15 is a layout of a superjunction semiconductor device according to a third embodiment of the present invention.
Figure 16:
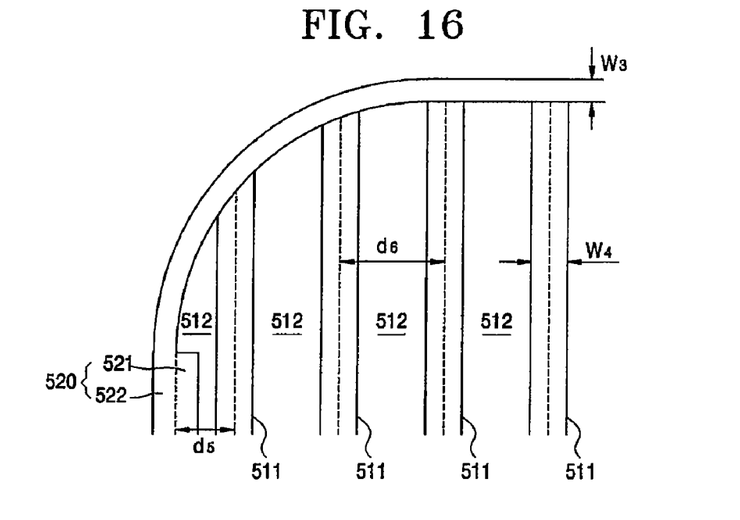
FIG. 16 illustrates a part of the superjunction semiconductor device of FIG. 15.

FIG. 15 is a layout of a superjunction semiconductor device 500 according to a third embodiment of the present invention, and FIG. 16 illustrates a part of the superjunction semiconductor device 500, including a corner of the superjunction semiconductor device 500.

Referring to FIGS. 15 and 16, the superjunction semiconductor device 500 includes an active region 510, an edge p pillar 520 having a rectangular ring shape with rounded corners and surrounding the active region 510, and a termination region 530 surrounding the edge p pillar 520. Active p pillars 511 and active n pillars 512 having striped shapes are alternately arranged in the horizontal direction in the active region 510. In the termination region 530, termination p pillars and termination n pillars (not shown) which have the same shape as the edge p pillar 520 are alternately arranged.

The edge p pillar 520 includes an inner region 521 adjacent to the active region 510 and an outer region 522 adjacent to the termination region 530, which are divided by a central axis. While the outer region 522 is disposed around the entire active region 510, the inner region 521 is disposed only along opposite sides of the active region 510. This is because p charges included in the outer region 522 of the edge p pillar 520 are used to balance n charges in the termination region 530 but p charges included in the inner region 521 of the edge p pillar 520 are used to balance n charges in only part of the active region 510.

Specifically, the rounded corners, and upper and lower parts of the edge p pillar 520 have the outer region 522 but not the inner region 521. Accordingly, the width W3 of the edge p pillar 520 in the rounded corners, and upper and lower parts of the edge p pillar 520 is identical to the width of the outer region 522 and is equal to half the width W4 of the active p pillar 511 in the active region 510. Each side of the edge p pillar 520 includes both the inner region 521 and the outer region 522. The quantity of p charges included in the inner regions 521 of the edge p pillar 520 is used to balance the quantity of n charges in the active n pillars 512 in the active region 510. Thus, surplus p charges are not generated even when the inner regions 521 exist adjacent to sides of the edge p pillar 520. To balance p charges included in the inner regions 521 in the sides of the edge p pillar 520 with the quantity of n charges in the active n pillars 512, the distance d5 between a central axis of the edge p pillar 520 and a vertical central axis of the active p pillar 511 disposed closest to the edge p pillar 520 is identical to the distance d6 between the vertical central axes of neighboring active p pillars 511.

In the superjunction semiconductor device 500 according to the third embodiment of the present invention, the quantity of p charges and the quantity of n charges are not balanced in the corners and thus insufficient charges will be supplemented in the corners. For this, the structures shown in FIGS. 11, 12, 13 and 14 can be applied to the superjunction semiconductor device 500 according to the third embodiment of the present invention.

Figure 17:
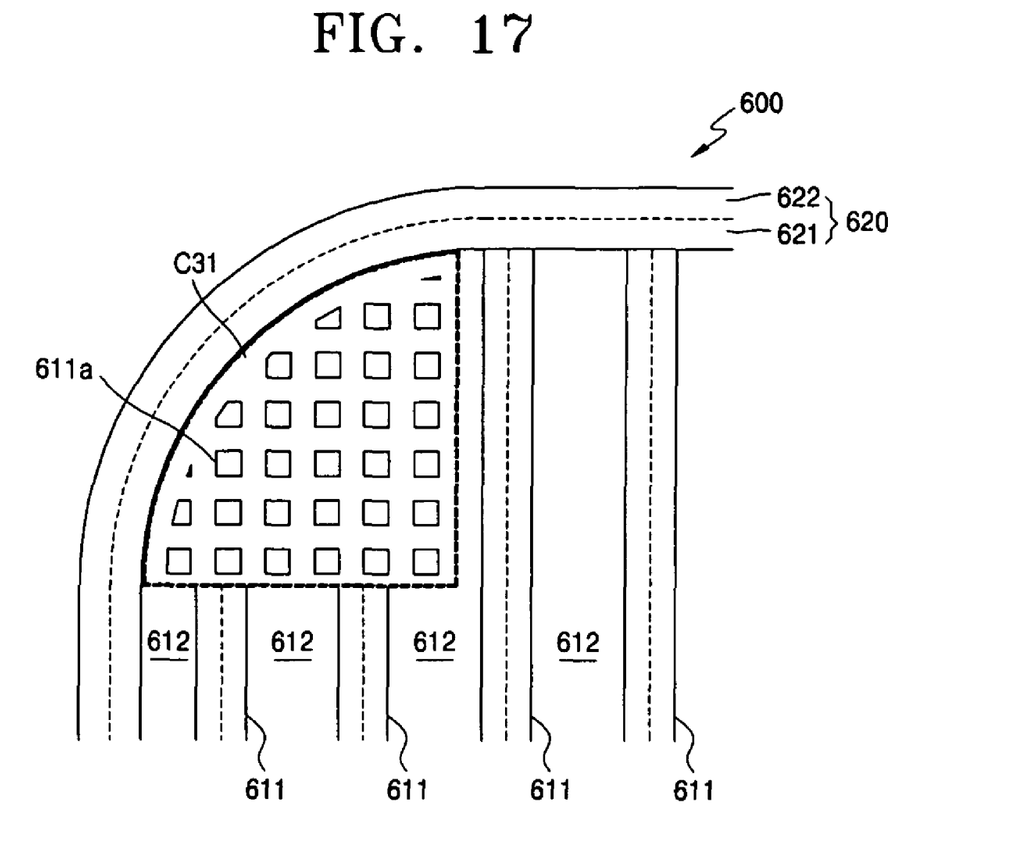
FIG. 17 illustrates a part of a superjunction semiconductor device according to a fourth embodiment of the present invention.

FIG. 17 partially illustrates a superjunction semiconductor device 600 according to a fourth embodiment of the present invention. Referring to FIG. 17, the superjunction semiconductor device 600 has an edge p pillar 620 having a rectangular ring shape with rounded corners and surrounding the active region. The edge p pillar 620 includes an inner region 621 adjacent to the active region and an outer region 622 away from the active region, which are divided by a central axis. The superjunction semiconductor device 600 has a similar structure to those of the superjunction semiconductor devices according to the first, second and third embodiments of the invention, except for the structure of a corner region C31 in the active region. Specifically, p regions 611a having island shapes are arranged in a matrix form in the corner region C31. The sizes of the p regions 611a are determined such that the quantity of p charges included in the p regions 611a and the quantity of n charges included in the active n pillars 612 are balanced in the corner region C31.

As described above, according to the present invention, p charges that are not used to balance the quantity of p charges and the quantity of n charges among p charges included in the upper and lower parts of the edge p pillar are eliminated or n charges are supplemented to balance the quantity of p charges and the quantity of n charges. Furthermore, the subsidiary p pillars are used to balance the quantity of p charges and the quantity of n charges in the corners, to thereby prevent the breakdown characteristics of the superjunction semiconductor device from being deteriorated in a specific region and improve reliability of the superjunction semiconductor device.

The various embodiments of the present invention may be combined with one or more of a number of charge spreading techniques as well as other device structures and manufacturing processes disclosed in the commonly assigned application Ser. No. 11/026,276, filed Dec. 29, 2004, and incorporated herein by reference in its entirety, to achieve a lower on-resistance, higher blocking capability and higher efficiency, among other advantages and features.

The layout views of the different embodiments may not be to scale, and as such are not intended to limit the possible variations in the layout design of the corresponding structures.

Although a number of specific embodiments are shown and described above, embodiments of the invention are not limited thereto. For example, it is understood that the doping polarities of the structures shown and described could be reversed without departing from the invention. Further, the features of one or more embodiments of the invention may be combined with one or more features of other embodiments of the invention without departing from the scope of the invention. Therefore, the scope of the present invention should be determined not with reference to the above description but should, instead, be determined with reference to the appended claim, along with their full scope of equivalents.

What is claimed is:

1. A superjunction semiconductor device comprising:
   an edge p pillar having a rectangular ring shape with rounded corners;
   an active region surrounded by the edge p pillar, the active region having active p pillars arranged in an n region so as to form alternating active p and n pillars in the active region, the active p pillars having a stripe shape and extending in parallel along a vertical dimension with top and bottom ends separated from the edge p pillar;
   a termination region surrounding the edge p pillar; and
   one or more subsidiary p pillars each having a top end and a bottom end, the one or more subsidiary p pillars being disposed in the n region between a first active p pillar and a second active p pillar, a top end of the first active p pillar being lower, along the vertical dimension, than a top end of the second active p pillar, the one or more subsidiary p pillars being located between the top end of the first active p pillar and the top end of the second active p pillar such that the bottom end of each of the one or more subsidiary p pillars does not extend below the top end of the first p pillar, and the top end of each of the one or more subsidiary p pillars does not extend above the top end of the second p pillar, wherein a width of the bottom end of each of the one or more subsidiary p pillars is narrower than a width of the n pillars at the bottom end of the one or more subsidiary p pillars along a dimension perpendicular to the vertical dimension.

2. The superjunction semiconductor device of claim 1, wherein a distance between the central axis of a horizontally extending portion of the edge p pillar and the top end of a plurality of the active p pillars is equal to half the distance between the vertical central axes of neighboring active p pillars.

3. The superjunction semiconductor device of claim 2, wherein a distance between the central axis of a vertically extending portion of the edge p pillar and the vertical central axis of the corresponding active p pillar disposed closest to the vertically extending portion of the edge p pillar is identical to the distance between the vertical central axes of neighboring active p pillars.

4. The superjunction semiconductor device of claim 1, wherein a width of the edge p pillar is identical to a width of each of the active p pillars.

5. A superjunction semiconductor device comprising:
an active region surrounded by an edge p pillar, the active region including active p pillars in the shape of stripes that extend in parallel along a vertical dimension, the active p pillars being arranged in an n region so as to form alternating active p and n pillars in the active region, the active p pillars being spaced from the edge p pillar,
wherein a width of an upper portion of a first one of the active p pillars in a corner of the active region gradually increases along the vertical dimension toward an end of the first one of the active p pillars so that a width of the first one of the active p pillars at the end of the first one of the active p pillars is wider than a width of a middle section of the first one of the active p pillars, wherein the width of an upper portion of a first one of the active p pillars and the width of a middle section of the first one of the active p pillars extend along a dimension perpendicular to the vertical dimension.

6. The superjunction semiconductor device of claim 5, wherein a width of upper and lower portions of the active p pillars are gradually increased in the corners of the active region to compensate for lower quantity of p charges than quantity of n charges in the corners of the active region.

7. The superjunction semiconductor device of claim 5 further comprising a termination region including termination n pillars and termination p pillars alternately arranged around the edge p pillar.

8. The superjunction semiconductor device of claim 1, wherein the subsidiary p pillars are bar shaped and are vertically arranged in the corners of the active region.

9. The superjunction semiconductor device of claim 1, wherein the subsidiary p pillars are in the form of islands arranged at predetermined intervals in the corners of the active region.

10. The superjunction semiconductor device of claim 1, wherein the subsidiary p pillars are in the shape of a bent belt and extend parallel to the edge p pillar.

11. The superjunction semiconductor device of claim 1, wherein the termination region includes alternately arranged termination n pillars and termination p pillars.

12. The superjunction semiconductor device of claim 5, wherein a distance between a central axis of a horizontally extending portion of the edge p pillar and a top end of a plurality of the active p pillars is equal to half the distance between the vertical central axes of neighboring active p pillars.

13. The superjunction semiconductor device of claim 12, wherein a distance between a central axis of a vertically extending portion of the edge p pillar and the vertical central axis of a corresponding active p pillar disposed closest to the vertically extending portion of the edge p pillar is identical to the distance between the vertical central axes of neighboring active p pillars.

14. The superjunction semiconductor device of claim 5, wherein a width of the edge p pillar is identical to a width of each of the active p pillars.

15. The superjunction semiconductor device of claim 5, wherein a width of an upper portion of a second one of the active p pillars in the corner of the active region gradually decreases toward an end of the second one of the active p pillars.

* * * * *